United States Patent [19]

Suzuki

[11] Patent Number: 4,837,512

[45] Date of Patent: Jun. 6, 1989

[54] METHOD AND SYSTEM FOR ACQUIRING MOTIONAL INFORMATION OF OBJECT IN MAGNETIC RESONANCE

[75] Inventor: Hirokazu Suzuki, Ootawara, Japan

[73] Assignee: Kabushiki Kaisha Toshiba, Kawasaki, Japan

[21] Appl. No.: 135,272

[22] Filed: Dec. 21, 1987

[30] Foreign Application Priority Data

Dec. 22, 1986 [JP] Japan .................. 61-303998

[51] Int. Cl.$^4$ .................................. G01R 33/20
[52] U.S. Cl. .................................. 324/306; 324/309
[58] Field of Search ............... 324/300, 307, 309, 312, 324/318, 322; 128/653

[56] References Cited

U.S. PATENT DOCUMENTS

| | | | |
|---|---|---|---|
| 4,574,239 | 3/1986 | Singer | 324/306 |
| 4,683,431 | 7/1987 | Pattany | 324/306 |
| 4,689,560 | 8/1987 | Nayler | 324/306 |
| 4,724,388 | 2/1988 | Sano | 324/309 |

Primary Examiner—Michael J. Tokar
Attorney, Agent, or Firm—Foley & Lardner, Schwartz, Jeffery, Schwaab, Mack, Blumenthal & Evans

[57] ABSTRACT

A scan is performed by a multi-echo method using a static field applying unit, a gradient field applying unit and an RF pulse transmitter, so as to obtain first and second echo signals. The phases of the first and second echo signals are detected by echo signal detector. The first and second echo signals have the same phase with respect to an unmoving region, a difference of the phases of these two echo signals for the unmoving region becomes zero. The phase difference occurs only for a moving region, i.e., only at a point where the object is moving. Therefore, information on the motion of the object for those points where the phase difference occurs is calculated in a computer by performing the subtraction of the phases of the first and second echo signals at the same position. The result is displayed on display.

15 Claims, 5 Drawing Sheets

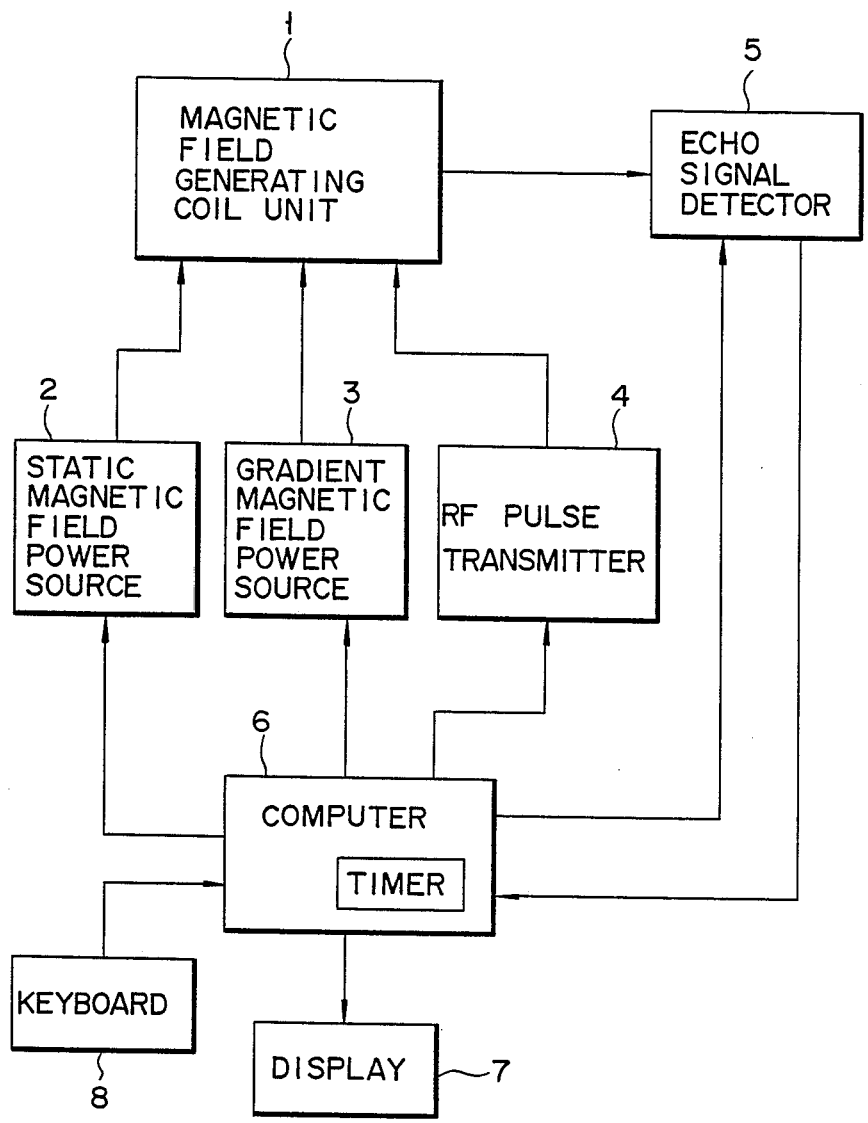
F I G. 1

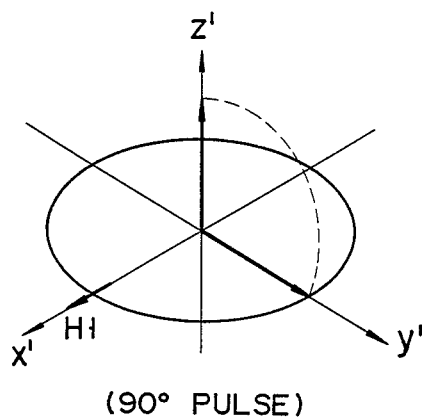
FIG. 3A (90° PULSE)
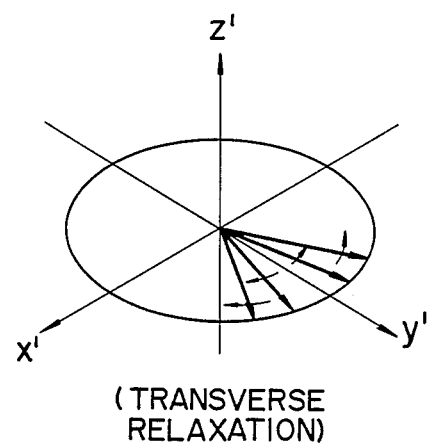
FIG. 3B (TRANSVERSE RELAXATION)
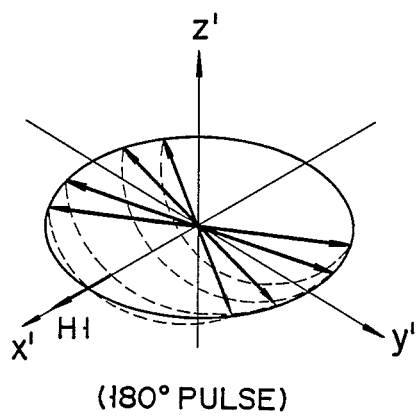
FIG. 3C (180° PULSE)
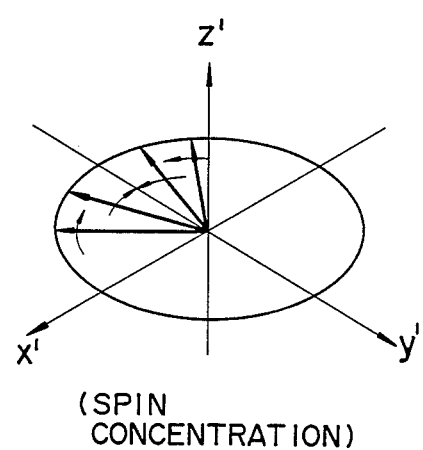
FIG. 3D (SPIN CONCENTRATION)

(FIRST ECHO)

(TRANSVERSE RELAXATION)

(180° PULSE)

(SECOND ECHO)

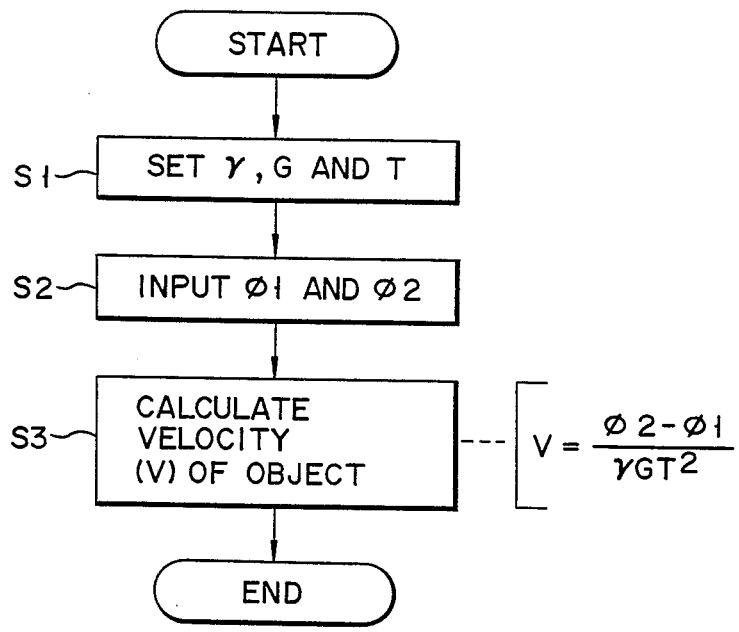
F I G. 4

METHOD AND SYSTEM FOR ACQUIRING MOTIONAL INFORMATION OF OBJECT IN MAGNETIC RESONANCE

BACKGROUND OF THE INVENTION

The present invention relates to a method and a system for acquiring motional information of an object in only one scan in a magnetic resonance imaging (hereinafter referred to as "MRI").

Conventionally, the phase difference of spin echo signals is utilized to obtain a blood flow rate in MRI. For instance, images of an object in systole and diastole periods of a heart are acquired in synchronism with a cardiogram signal, and in view of the fact that blood flow rates in these periods differ from each other, these images are subtracted from each other to acquire the blood flow rate. In this case, to obtain the images for the heart's systole and diastole periods, it detects an echo signal from an excitation caused by application of a 90° pulse to the object. Therefore, the scan is performed twice to obtain the two images. That is, it performs twice the scan for obtaining an echo signal by applying a 90° pulse and then a 180° pulse to the object.

Since the conventional method performs the scan at least twice, it is difficult to detect the blood flow rate in a short period of time.

Further, as explained below, it is difficult to detect the blood flow rate by one the scan. For example, the spin phase $\phi$ of an echo signal, which is acquired after a time $T_E/2$ from a point at which a 180° pulse has been applied after a time $T_E/2$ from application of the 90° pulse, i.e., after a time $T_E$ from application of the 90° pulse, is taken by the following equation.

$$\phi = -\gamma G v T_E^2/4 + \phi \text{system} \quad (1)$$

where G is the intensity of the gradient field, $\gamma$ is the magnetogyric ratio, v is the velocity of an object and $\phi$system is a systematic phase error of an MRI apparatus. In equation (1), $\phi$, G, $\gamma$ and $T_E$ are known. However, $\phi$system is unknown, the accurate velocity v cannot be obtained without considering the term $\phi$system.

Therefore, there is a demand for a method for acquiring motional information of an object by only one scan without any influence of the systematic phase error of the MRI apparatus.

SUMMARY OF THE INVENTION

The object of this invention is to provide a method and a system for acquiring motional information of an object with only one scan in MRI.

According to one aspect of this invention, there is provided a method for acquiring motional information of an object in magnetic resonance comprising the steps of:

exciting a selected slice of the object by an application of a 90° pulse;
applying a first 180° pulse after a first time from the application of the 90° pulse;
detecting a first echo signal after a second time from the application of the 90° pulse;
applying a second 180° pulse after a third time from the application of the 90° pulse;
detecting a second echo signal after a fourth time from the application of the 90° pulse;
subtracting phases of the detected first and second echo signals from each other; and
calculating motional information of the object from a result of the subtraction.

According to another aspect of this invention, there is provided a system for acquiring motional information of an object in magnetic resonance comprising:

static field applying means for applying a static field to the object;
gradient field applying means for applying a gradient field to the object;
RF pulse applying means for applying an RF pulse to the object;
controlling means for controlling the static field applying means, the gradient field applying means and the RF pulse applying means;
detecting means for detecting phases of a plurality of echo signals from the object by the controlling means; and
calculating means for calculating motional information of the object by using the detected phases of the echo signals.

BRIEF DESCRIPTION OF THE DRAWINGS

FIG. 1 is a block diagram of an MRI system according to one embodiment of this invention;

FIGS. 3A, 3B, 3C, 3D, 3E, 3F, 3G and 3H show spin states according to a multi-echo method; and FIG. 4 is a flowchart for calculating the velocity of an object.

DETAILED DESCRIPTION OF THE PREFERRED EMBODIMENT

Figure 2:
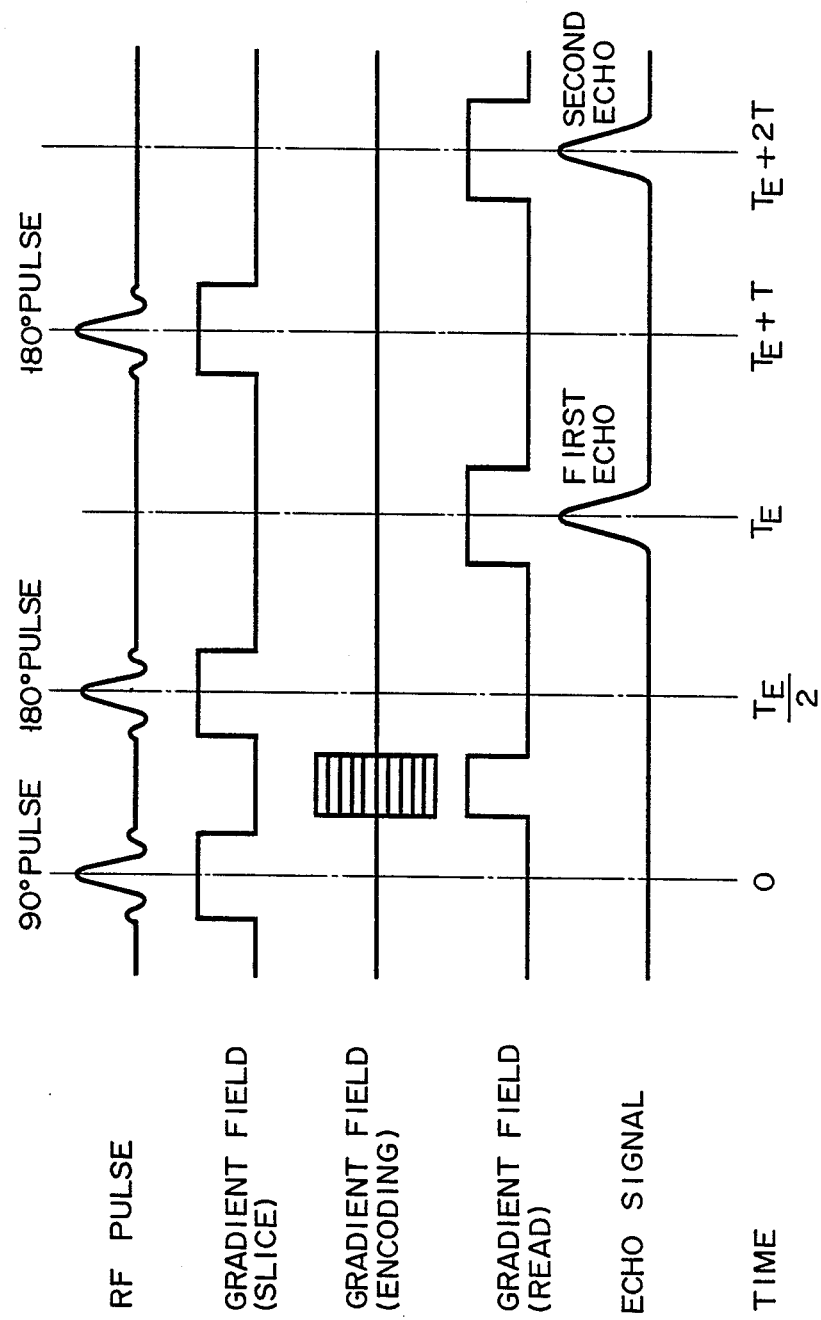
FIG. 2 is a spin echo sequence for acquiring first and second echo signals.

One embodiment of this invention will now be explained referring to the accompanying drawings.

In FIG. 1 the present system comprises magnetic field generating coil unit 1, static magnetic field power source 2, gradient magnetic field power source 3, RF pulse transmitter 4, echo signal detector 5, computer 6, display 7 and keyboard 8.

Magnetic field generating coil unit 1 has a static field coil, a gradient field coil and an RF field coil, and an object is put in the coil unit 1 for examination. These three types of coils generate static, gradient and RF fields when energized by the static magnetic field power source 2, gradient magnetic field power source 3 and RF pulse transmitter 4, respectively. Magnetic field generating coil unit 1 further has coils for receiving echo signals, which are detected by echo signal detector 5. Computer 6 calculates the velocity of the object by the phases of the detected echo signals, and the result is displayed on display 7. This computer 6 controls the generation of each field and the receiving and processing of the echo signals. A timer is built in the computer 6.

Figure 3E:
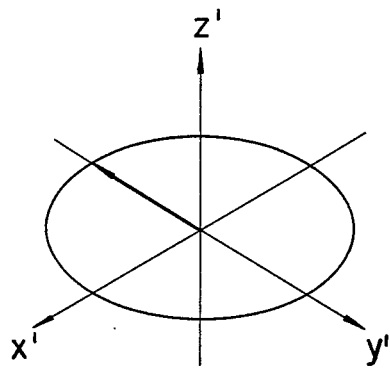
Figure 3F:
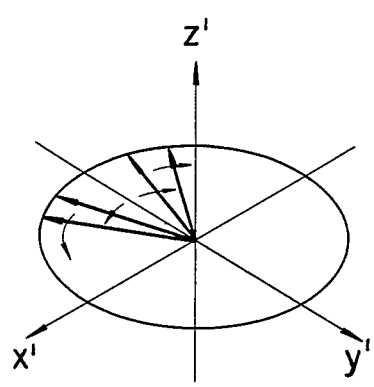
Figure 3G:
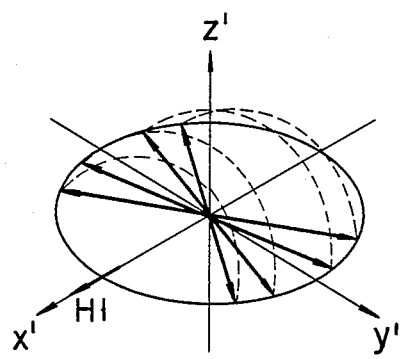
Figure 3H:
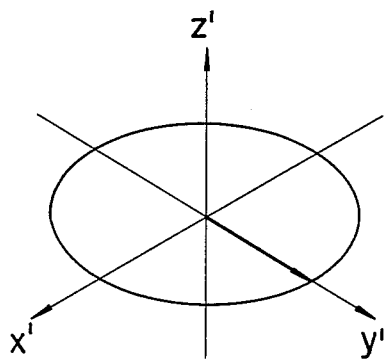

According to this embodiment, first and second echo signals are detected in accordance with the sequence shown in FIG. 2, using a multi-echo method in the above system. First, a selected slice is excited by application of a 90° pulse. In the rotating frame of spin, the spin facing in the z' direction by application of a static field is faced to the y' direction (FIG. 3A). Then, the spin starts transverse relaxation on the x'-Y' plane (FIG. 3B). When a 180° pulse, such as on inversion pulse for inverting the spin, is applied to the object after a time $T_E/2$ from the application of the 90° pulse, the spin whose phase has been inverted is rotated 180° about the x' axis (FIG. 3C). The spin starts to concentrate to the −y' axis (FIG. 3D) and concentrates to the −y' axis after a time $T_E$ from the application of the 90° pulse. An amplitude of the echo signal at this time temporarily becomes a maximum (FIG. 3E), so that this echo signal is acquired as the first echo signal. Thereafter, the spin starts transverse relaxation (FIG. 3F) so that a 180° pulse is applied to the object after a time ($T_E+T$) from the application of the 90° pulse. The spin at this time is rotated 180° from the state shown in FIG. 3F (FIG. 3G). After a time ($T_E+2T$) from the application of the 90° pulse, the spin concentrates to +y' axis (FIG. 3H), and the echo signal at this time is acquired as the second echo signal. In FIG. 3, H1 is a RF pulse.

As can be seen from FIG. 2, there are three gradient fields used for the selection of a slice to be excited, phase encoding and reading of an echo signal, respectively, and these three fields are generated in accordance with the spin echo sequence.

With the use of the multi-echo method, the spin phase of an echo signal at each point can be obtained. More specifically, when the object is moving with a velocity v, spin phase $\phi 1$ of the first echo signal and spin phase $\phi 2$ of the second echo signal at the same position in the motion are expressed as:

$$\phi 1 = -\gamma G v T_E^2/4 + \phi_{system} \quad (2)$$

$$\phi 2 = -\gamma G v T_E^2/4 + \gamma G v T^2 + \phi_{system} \quad (3).$$

Subtracting $\phi 1$ from $\phi 2$, v is taken by
$$v = (\phi 2 - \phi 1)/\gamma G T^2 \quad (4).$$

Although the systematic phase error $\phi_{system}$ of an MRI apparatus is included in each phase, since the phase error can be eliminated by performing the subtraction of the two phases from each other, the velocity v can be obtained.

When the phases of the first and second echo signals are subtracted from each other, a difference of the phases of an unmoving region becomes zero and a phase difference appears on a moving region. Therefore, the velocity v can be obtained by performing the subtraction of the two phases at the same position and using equation (4) only to the points where a phase difference occurs.

Referring now to the flowchart of FIG. 4, the calculating process of the velocity of the object by using computer 6 will be explained below.

In Step S1, the magnetogyric ratio $\gamma$, gradient field intensity G and a time T from a point where the first echo signal is obtained to a point where the second 180° pulse is applied are set to computer 6 by keyboard 8. The time T is measured by computer 6. In step S2, the phases $\phi 1$ and $\phi 2$ of the first and second echo signals detected by echo signal detector 5 are input to computer 6, the velocity v of the object was calculated by substituting these parameters to equation (4) (step S3).

Through the above sequence, the velocity of the object can easily be obtained.

According to this embodiment, the velocity of the object can be obtained in a short period of time by subtracting the spin phases of the first and second echo signals obtained in only one scan. This process is not influenced by the systematic phase error of an MRI apparatus.

Needless to say, this invention is not limited to the above embodiment, but can be modified in various manners within the scope and spirit of this invention.

For instance, according to the above embodiment, the time T from the point where a 180° pulse is applied to the object to the point where the second echo signal is obtained is generally set to be $T = T_E/2$, so that $\phi 2 = \phi_{system}$. The present method can also apply to this case. That is, $$\phi 2 - \phi 1 = \gamma G v T_E^2/4 \quad (5).$$

By this equation (5), the velocity v was written as follows:

$$v = 4(\phi 2 - \phi 1)/\gamma G T_E^2 \quad (6).$$

What is claimed is:

1. A method for acquiring a velocity of liquid inside an object in magnetic resonance, the method comprising the steps of:
   exciting a selected slice of the object by an application of a 90° pulse;
   applying a first 180° pulse after a first period of time from the application of the 90° pulse;
   detecting a first echo signal after a second period of time from the application of the 90° pulse;
   applying a second 180° pulse after a third period of time from the application of the 90° pulse;
   detecting a second echo signal after a fourth period of time from the application of the 90° pulse;
   subtracting phases of the detected first and second echo signals from each other; and
   calculating the velocity of the liquid inside the object from a result of the subtraction.

2. The method according to claim 1, wherein with a period of time $T_E$ from the application of the 90° pulse to a point at which the first echo signal is obtained, the first 180° pulse is applied after a period of time $T_E/2$ from the application of the 90° pulse.

3. The method according to claim 1, wherein with a period of time 2T from a point at which the first echo signal is obtained to a point at which the second echo signal is obtained, the second 180° pulse is applied after a time T from the point at which the first echo signal is obtained.

4. The method according to claim 1, wherein velocity v of the liquid inside of the object is obtained by:

$$v = (D2 - D1)/QGT^2,$$

where Q is a magnetogyric ratio, G is a gradient field intensity, T is a period of time from a point at which the first echo signal is obtained to a point at which the second 180° pulse is applied, D1 is a phase of the first echo signal and D2 is a phase of the second echo signal.
w 5. A system for acquiring a velocity of a liquid inside an object in magnetic resonance, the system comprising:
   static field applying means for applying a static field to the object;
   gradient field applying means for applying a gradient field to the object;
   RF pulse applying means for applying an RF pulse to the object;
   controlling means for controlling the static field applying means, the gradient field applying means and the RF pulse applying means;

detecting means for detecting phases of a plurality of echo signals from the object; and calculating means for calculating the velocity of the liquid inside the object by subtracting the phases of the echo signals detected by the detecting means.

6. The system according to claim 5, wherein velocity v of the liquid inside the object calculated by the calculating means is obtained by the following equation:

$$v=(D2-D1)/QGT^2,$$

where Q is a magnetogyric ratio, G is a gradient field intensity, T is a period of time from a point at which a first echo signal is obtained to a point at which a second 180° pulse is applied, D1 is a phase of a first echo signal and D2 is a phase of a second echo signal.

7. The system according to claim 5, wherein the controlling means includes means for measuring a period of time from an application of a 90° pulse.

8. The system according to claim 5, wherein the gradient field applying means includes:

first field generating means for generating a gradient field for selecting a slice of the object to be excited;

second field generating means for generating a gradient field for encoding phases, and third field generating means for generating a gradient field for reading echo signals.

9. The system according to claim 5, further comprising display means for displaying the velocity of the liquid inside the object calculated by the calculating means.

10. A method for acquiring a velocity of a liquid in magnetic resonance, the method comprising the steps of:

applying a magnetic resonance excitation pulse;

applying a first inversion pulse after a first period of time from the application of the magnetic resonance excitation pulse;

detecting a first echo signal after a second time period from the application of the magnetic resonance excitation pulse;

applying a second inversion pulse after a third period of time from the application of the magnetic resonance excitation pulse;

detecting a second echo signal after a fourth period of time from the application of the magnetic resonance excitation pulse;

subtracting phases of the detected first and second echo signals from each other; and calculating the velocity of the liquid from results of the subtraction.

11. The method according to claim 10, wherein with a period of time $T_E$ from the application of the magnetic resonance excitation pulse to a point at which the first echo signal is obtained, the first inversion pulse is applied after a period of time $T_E/2$ from the application of the magnetic resonance excitation pulse.

12. The method according to claim 10, wherein with a period of time 2T from a point at which the first echo signal is obtained to a point at which the second echo signal is obtained, the second inversion pulse is applied after a period of time T from the point at which the first echo signal is obtained.

13. The method according to claim 10, wherein the velocity of v of the liquid is obtained by:

$$v=(D2-D1)/QGT^2,$$

where Q is a magnetogyric ration, G is a gradient field intensity, T is a period of time from a point at which the first echo signal is obtained to a point at which the second inversion pulse is applied, D1 is a phase of the first echo signal and D2 is a phase of the second echo signal.

14. A method for acquiring a velocity of a liquid in magnetic resonance, the method comprising the steps of;

applying a magnetic resonance excitation pulse;

applying a first inversion pulse;

detecting a first echo signal;

applying a second inversion pulse;

detecting a second echo signal;

subtracting phases of the detected first and second echo signals from each other, thereby obtaining phase information; and acquiring the velocity of the liquid from phase information.

15. The method according to claim 14, wherein the velocity v of the liquid is obtained by:

$$v=(D2-D1)/QGT^2,$$

where Q is a magnetogyric ratio, G is a gradient field intensity, T is a period of time from a point at which the first echo signal is obtained to a point at which the second inversion pulse is applied, D1 is a phase of the first echo signal and D2 is a phase of the second echo signal.

* * * * *